United States Patent [19]

Van Gorkum

[11] Patent Number: 5,070,387

[45] Date of Patent: Dec. 3, 1991

[54] SEMICONDUCTOR DEVICE COMPRISING UNIDIMENSIONAL DOPING CONDUCTORS AND METHOD OF MANUFACTURING SUCH A SEMICONDUCTOR DEVICE

[75] Inventor: Aart A. Van Gorkum, Eindhoven, Netherlands

[73] Assignee: U.S. Philips Corp., New York, N.Y.

[21] Appl. No.: 688,373

[22] Filed: Apr. 19, 1991

Related U.S. Application Data

[63] Continuation of Ser. No. 495,013, Mar. 15, 1990, abandoned.

[30] Foreign Application Priority Data

Mar. 29, 1989 [NL] Netherlands ............... 8900767

[51] Int. Cl.⁵ ............... H01L 29/04; H01L 29/167; H01L 29/20
[52] U.S. Cl. .............................. 357/60; 357/23.2; 357/41; 357/55; 357/63; 357/88
[58] Field of Search ............... 357/16, 4, 4 SL, 23.1, 357/88, 23.2, 41, 55, 63, 60

[56] References Cited

U.S. PATENT DOCUMENTS 4,591,889  5/1986  Gossard et al. .................. 357/16
4,872,046 10/1989  Morkoc et al. .................. 357/16

Primary Examiner—Andrew J. James
Assistant Examiner—Ngan Van Ngo
Attorney, Agent, or Firm—Steven R. Biren

[57] ABSTRACT

The invention relates to a semiconductor device having a semiconductor substrate, on which a semiconductor layer is provided, which includes sunken or buried strip-shaped conducting regions, which have strip-shaped subregions, in which doping elements are present. Semiconductor devices having such so-called quasi unidimensional conductors constitute potentially important parts of electronic circuits or components. According to the invention, the strip-shaped conducting regions and the strip-shaped subregions are located with a side facing the substrate substantially in one plane, which is a vicinal plane of a major crystal surface of the semiconductor body, of which the semiconductor device forms part. The subregions can also have a very small width and thickness of about 0.3 to 2 nm and can be manufactured in a comparatively simple manner.

16 Claims, 3 Drawing Sheets

SEMICONDUCTOR DEVICE COMPRISING UNIDIMENSIONAL DOPING CONDUCTORS AND METHOD OF MANUFACTURING SUCH A SEMICONDUCTOR DEVICE

This is a continuation of application Ser. No. 495,013, filed Mar. 15, 1990, now abandoned.

BACKGROUND OF THE INVENTION

The invention relates to a semiconductor device comprising a semiconductor body having a semiconductor substrate and disposed thereon a semiconductor layer, which comprises at least one group of parallel strip-shaped conducting regions having a higher conductivity than the semiconductor layer in which they are sunk or buried and comprise strip-shaped subregions, within which doping elements are present. The invention further relates to the manufacture of such a device.

Such semiconductor devices potentially form important parts of electronic circuits or components. The strip-shaped conducting regions can serve inter alia as very small and nevertheless very good conducting connection wires between components. Additional, they can be used in components, such as field effect transistors, in which they give rise to very high transconductances due to their high conductivity as compared with bulk material while the transistor can be very small.

Such a semiconductor device and such a method of manufacturing it are known from the abstract in the English language of Japanese Kokai 63-99522 (date of publication 30-4-1988) published in Pat. Abstracts of Japan, Vol. 12, Sept. 12, 1988, No. 337 (E-657), p. 18, under number E-65718. In this publication, strip-shaped conducting regions are described, which are buried or sunk in a semiconductor layer comprising gallium arsenide. The conducting strip-shaped regions comprise strip-shaped subregions doped with silicon. These subregions are formed in that during the deposition of the semiconductor layer a strip-shaped interference pattern of soft X-ray radiation is projected onto the growing surface. At the area at which the intensity of the radiation is highest, silane in the gaseous phase is decomposed and silicon is incorporated into a strip-shaped subregion. The width of a subregion is a few tens to a few hundreds of Angstroms, depending upon the wavelength of the X-ray radiation used. The free charge carriers are then present in a wider strip-shaped conducting region, within which the strip-shaped subregion is situated.

A disadvantage of the known semiconductor device is that the smallest attainable width of the strip-shaped subregions is too large for a maximum conductivity of the conducting strip-shaped regions. Another disadvantage is that in addition to doping elements, a comparatively large quantity of semiconductor material is also incorporated into the strip-shaped subregions, as a result of which the conducting strip-shaped regions do not have maximum conductivity. Finally, a disadvantage of the known method is that it is comparatively complicated.

SUMMARY OF THE INVENTION

The present invention has inter alia for its object to provide a semiconductor device and a method of manufacturing it, in which the said disadvantages are avoided entirely or at least to a great extent, as a result of which strip-shaped conducting regions having a high conductivity are obtained in a simple manner.

The invention is based inter alia on the recognition of the fact that the object aimed at can be realized in that the strip-shaped subregions are manufactured in a selective manner without using external means.

According to the invention, a semiconductor of the kind described above is for this purpose characterized in that the strip-shaped conducting regions and the strip-shaped subregions are located with a side facing the substrate substantially in the same plane, which is a vicinal plane of a major crystal surface of the semiconductor body. When the starting material is a semiconductor body whose surface constitutes a vicinal plane with respect to a major crystal surface, this surface has a stepped profile. The strip-shaped subregions can then be constituted in that doping elements are selectively incorporated at one step of the stepped profile. This requires that only or substantially only doping elements or compounds thereof are supplied at the surface and that the latter have a sufficiently high surface mobility to reach from the area at which they strike the surface a step at which they are incorporated.

In a first embodiment, the conducting strip-shaped regions have in a direction perpendicular to the longitudinal direction dimensions which are substantially equal to the wavelength of the free charge carriers present in these regions. The doping elements are located within the subregions; the free charge carriers formed therefrom can be displaced to a given distance therefrom. When neglecting the dimensions of the strip-shaped subregions, this distance is determined by the quantity of charge carriers and by the choice of the semiconductor material from which the semiconductor layer is manufactured.

In another embodiment, the relative distance of the strip-shaped regions is smaller than the wavelength of the free charge carriers present in the strip-shaped conducting regions. In this manner, the different strip-shaped conducting regions are coupled and an increased conductivity of all the strip-shaped conducting regions together is obtained due to a high density of charge carriers.

In a further embodiment of a semiconductor device according to the invention, the strip-shaped subregions have in a direction perpendicular to the longitudinal direction dimensions which are at least from a quarter to one lattice constant of the semiconductor material of the semiconductor layer. The minimum thickness of a subregion is determined by the height of one stage of the stepped profile. This height will generally be from a quarter to one lattice constant of the semiconductor layer. For a material such as silicon, the stage will have a height of at least a quarter—so called single step—, but preferably a half—so called double step—of the lattice constant. For this material, the lattice constant is about 0.54 nm. Some deviation in the thicknesses corresponding to the fractions given here can occur due to the fact that a doping element will have a radius different from that of the silicon atom. For a material such as gallium arsenide, it holds not only that the lattice constant has a slightly different value, but also that a so-called single step corresponds to half the lattice constant and a so-called double step corresponds to one lattice constant. The preference for a double step is connected with the fact that with this height of one stage a stepped profile with substantially straight and parallel stages can be formed, while with a height of a stage of a single step the stepped profile has more frayed stages. When the stepped profile has frayed stages, in addition to straight stages, growth will preferably take place at frayed stages. It will be evident that frayed stages are not or not particularly suitable for use with the present invention. Thicker layers can be obtained by stacking several strip-shaped subregions. In general, a thickness of the subregions corresponding to the height of one stage will be sufficient, however. The same consideration applies to the width. The width can be simply increased in that for a longer time doping elements are supplied at the surface. In general, from a theoretical viewpoint, minimum dimensions of the strip-shaped conductors are ideal if a subregion is desired in which in a manner analogous to the bidimensional case a "delta doping" is concerned. In this case, the free charge carriers present in the strip-shaped conducting regions are disturbed very slightly by the doping ions present in the "δ-shaped" quasi unidimensional strip-shaped subregions. As a result, the mobility ($\mu$) of the free charge carriers in the strip-shaped conducting regions is maximal, as a result of which, as appears from the following formula, the conductivity of the strip-shaped conducting regions is maximal.

$$\Sigma = 1/p = (q^* \mu^* n),$$

in which $\Sigma$ is the conductivity, p is the resistivity, q is the elementary charge and D is the number of free charge carriers per cm$^3$ within a strip-shaped conducting region. For the use of strip-shaped conductors in a field effect transistor, it will generally be desirable to realize a high conductivity only by means of a high mobility. In fact, when the number of c carriers also becomes large—which in itself is conducive to the conductivity—, the depletion of the strip-shaped conducting region will require a comparatively high voltage—for example more than 5 V—, which value, depending upon the specifications, may be higher than a voltage admissible in practice. Besides practical reasons, which are connected, for example, with the manufacture and which can imply that the width or the thickness of the strip-shaped subregions must be larger than the minimum width or thickness, there are also theoretical considerations which lead to the choice of a wider or thicker strip-shaped subregion.

In a further embodiment of a semiconductor device according to the invention, the volume concentration of doping elements within the strip-shaped subregions is larger than the maximum volume concentration in bulk semiconductor material forming the semiconductor layer. When the strip-shaped subregion is filled only or substantially only with doping elements, a very high volume concentration is locally attained. This is possible inter alia due to the small dimensions of the strip-shaped subregions, as a result of which the stresses occurring due to the high concentrations of the doping elements do not lead to a serious deterioration of the quality of the semiconductor layer. Due to the fact that the number of doping elements is large, the number of free charge carriers will also be large, which leads to a high concentration of free charge carriers (n) in the strip-shaped conducting region in which the strip-shaped subregion is located. As is shown by the aforementioned formula, the conductivity in the strip-shaped conducting region will also increase thereby. It will now also be evident that enlargement of the dimensions of the strip-shaped subregions perpendicular to the longitudinal direction can be effective to increase the concentration (n) of free charge carriers and thus to increase the conductivity ($\Sigma$). This is especially the case when the strip-shaped conducting regions are used as connection conductors. As already stated above, this is less desirable with the use in field effect transistors. However, it should be pointed out that even with minimum dimensions of a strip-shaped subregion a very high volume concentration of doping elements within the strip-shaped subregion compared to the concentration usual in bulk material may already be obtained.

In a further embodiment of a semiconductor device according to the invention, the major crystal surface is the (001) surface and the vicinal plane is parallel to the surface of the semiconductor body and has a misorientation in the (011) or the (0$\overline{1}$1) direction of at most a few degrees with respect to the major crystal surface. With such a misorientation of the surface, a stepped profile of parallel stages is obtained on the surface. The height of one stage is from a quarter to one lattice constant of the semiconductor body (a) and the distance between the stages (w) is determined by the misorientation ($\theta$) chosen according to the following formula:

$$\tan(\theta) = \theta = a/w.$$

It is assumed that for small angles the tangent of an angle is equal to the angle.

In a further embodiment, the semiconductor layer comprises at least two groups of parallel strip-shaped conducting regions arranged above each other, which groups are orientated with respect to each other in such a manner that, viewed in projection, a strip-shaped region of one group is located between two strip-shaped regions of an adjacent group. In this manner, a dense stacking of strip-shaped conducting regions is obtained. When the relative distance of the strip-shaped subregions is smaller than or equal to the dimensions of the strip-shaped conducting regions, a tridimensional superlattice is thus obtained, which consists of quasi unidimensional conductors. In this manner, a high mobility is obtained within the superlattice as far as the latter depends upon the density of the charge carriers. It should be noted that of course it is also possible to arrange the strip-shaped conducting regions, viewed in projection, above each other. Although this leads to a less dense stacking, it will also lead to an increased concentration of charge carriers within the superlattice.

In a further embodiment, the strip-shaped conducting regions are of the D-conductivity type. Although a semiconductor device according to the invention may also be used very successfully and advantageously for hole conduction, in general electron conduction is preferred because electrons generally have a considerably higher mobility than holes.

In a further embodiment of a semiconductor device according to the invention, the semiconductor layer comprises a III-V material. These materials—such as gallium arsenide and indium phosphide—are particularly suitable because of the high mobilities already given in bulk material.

In a further embodiment, the conducting strip-shaped regions have a width laying between about 40 and 200 nm and the strip-shaped regions have a width lying between about 0.2 and 2 nm. On the basis of calculations, with the said dimensions an optimum conductivity is expected for the material system given.

In a further embodiment of a semiconductor device according to the invention, the semiconductor layer comprises silicon. This material is particularly suitable because of the high degree of perfection the technology has attained for silicon.

In a further embodiment, the conducting strip-shaped regions have a width lying between about 10 and 100 nm and the strip-shaped subregions have a width lying between about 0.2 and 2 nm. On the basis of calculations, with the said dimensions an optimum conductivity is expected for the material system given.

In a further embodiment of a semiconductor device according to the invention, the strip-shaped conducting regions are used as connection conductors in an electronic circuit. For this purpose means are present on both end-sides of the strip-shaped conducting regions for providing a current in the length direction through the strip-shaped conducting regions. Both different components and parts of a component can be conductively connected to each other. Small dimensions and a high conductivity of the strip-shaped conducting regions afford a great advantage with increasing miniaturization of circuits and components.

A further embodiment of a semiconductor device according to the invention is characterized in that the semiconductor body comprises a semiconductor layer structure, which at least comprises successively in a cross-section the semiconductor substrate having a comparatively low doping concentration, a semiconductor layer disposed thereon having a comparatively low doping concentration, in which the group of conducting strip-shaped regions having a comparatively high concentration of free charge carriers is buried, two strip-shaped semiconductor regions sunken from the surface into the semiconductor layer and having a comparatively high doping concentration, whose longitudinal axis is substantially perpendicular to the longitudinal axis of the group of conducting strip-shaped regions and which are connected to the last mentioned regions, and a strip-shaped isolating layer, which is located on the surface of the semiconductor layer and on which a conducting layer is disposed. This device constitutes a MOS field effect transistor comprising quasi unidimensional conductors between source and drain. Due to the increased mobility, very high transconductances are obtained.

According to the invention, a method of manufacturing a semiconductor device is characterized in that a semiconductor substrate is provided with a stepped profile, after which atoms or molecules comprising a doping element are supplied at the surface, which have at the temperature chosen a sufficiently high surface mobility to reach a stage at which they are incorporated and constitute a strip-shaped subregion, which is located within a monolayer and extends parallel to the stage on the surface, after which the growth within the monolayer is continued by supplying solely atoms or molecules of a semiconductor material. In this manner, the strip-shaped conducting regions are formed around the strip-shaped subregions. As doping element use is preferably made of an element which has in the growing conditions chosen, such as growing temperature, a sufficiently high surface mobility to reach a stage of the stepped profile. For a material such as gallium arsenide, silicon and other doping elements of the n-conductivity type form suitable elements; for silicon, phosphorus, arsenic and antimony are suitable if n-type conductivity is desired. As growing technique use may be made of a technique of deposition from the gaseous phase, such as OMVPE (=Organo-Metallic Vapor Phase Epitaxy), VPE (=Vapor Phase Epitaxy) or MBE (=Molecular Beam Epitaxy). The semiconductor layer is then grown monolayer after monolayer and comprises at least one monolayer of which the strip-shaped subregions form part. The width of the subregions is determined by the quantity of doping elements supplied—as the case may be in the presence of elements constituting semiconductor material—or with a given supply per unit time by the time for which the doping elements are supplied at the surface. When thicker strip-shaped subregions are desired, during the growth of a next monolayer, the correct quantity of doping elements can be supplied at the correct instant—that is to say at the instant at which the new monolayer reaches a subregion in the subjacent monolayer.

A first embodiment of a method according to the invention is characterized in that at least one further monolayer is grown in such a manner that a strip-shaped subregion of the further monolayer is located, viewed in projection, between two strip-shaped subregions of the monolayer. By supplying doping elements at the correct instant during the growth of the further monolayer, a dense stacking of strip-shaped subregions and of strip-shaped conducting regions can be obtained.

In an another embodiment of the method according to the invention, the stepped profile is obtained by sawing a semiconductor substrate out of a semiconductor crystal in such a manner that the surface has a small misorientation with respect to a major crystal surface of the semiconductor crystal, the height of one stage corresponding to from a quarter to one lattice constant of the semiconductor crystal and the width of the stage being determined by the misorientation chosen and the height of the stage.

In a further embodiment of a method according to the invention, the growth of the strip-shaped subregions located within a monolayer takes place at a temperature which is insufficiently high for epitaxial growth and the growth is followed by conversion of the monolayer and the remaining parts of the semiconductor layer into monocrystalline material by a temperature treatment. This method is especially of importance when the doping elements have a strong surface segregation, such as with Sb in silicon. In this case, both the silicon semiconductor layer and the doping elements can be deposited at room temperature, after which by means of SPE (=Solid Phase Epitaxy) at about 550° C. conversion of the silicon into monocrystalline silicon takes place.

In a further embodiment of a method according to the invention, the growth of the strip-shaped subregions located within a monolayer takes place by forming at a sufficiently low temperature a large fraction of a monolayer of doping elements on the surface, after which, by heating at a sufficiently high temperature and for a sufficiently long time, such a quantity of the monolayer of doping elements is removed from the surface by baking that the strip-shaped subregions are obtained. This method, which has also successfully been used in growing bidimensional so-called "delta doping", can also advantageously be used in growing the strip-shaped subregions.

BRIEF DESCRIPTION OF THE DRAWING

A further explanation of the invention will now be given with reference to several embodiments and the accompanying drawing, in which.

Figure 1:
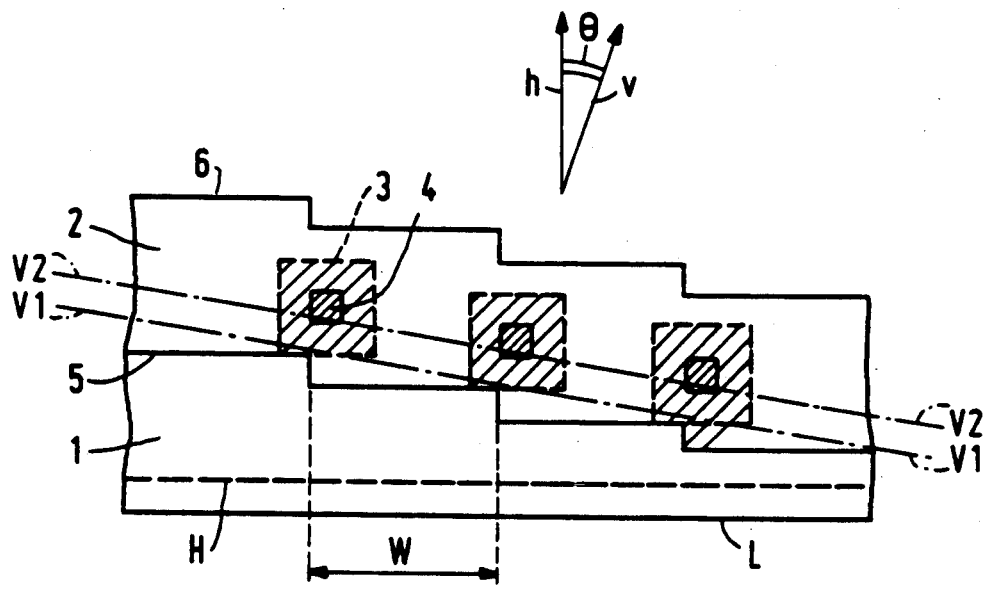
FIG. 1 shows in cross-section a first embodiment of a semiconductor device according to the invention.

The Figures are schematic and not drawn to scale, while more particularly the dimensions in the direction of thickness are exaggerated for the sake of clarity. Corresponding parts are generally designated by the same reference numerals in the different embodiments. Semiconductor regions of the same conductivity type are generally cross-hatched in the same direction. It should be noted that the strip-shaped regions are shown only very diagrammatically: in most cases, a cross-section will rather be substantially circular than rectangular. However, this also depends upon the dimensions of the strip-shaped conducting regions with respect to the dimensions of the strip-shaped subregions and upon whether semiconductor materials having a high band gap are present in the vicinity of the strip-shaped subregions or not. This also influences the accurate location of the strip-shaped subregions within the strip-shaped conducting regions. Mostly—but not necessarily—the strip-shaped subregions—as indicated in the Figures—will be arranged so that they are substantially centered with respect to the strip-shaped conducting regions.

DESCRIPTION OF THE PREFERRED EMBODIMENTS

FIG. 1 shows in cross-section a first embodiment of a semiconductor device according to the invention, which comprises a semiconductor body L, of which a representative part is shown in the Figure. The semiconductor body includes a substrate 1, consisting in this embodiment of silicon having a doping of $10^{14}$ at/cm$^3$ and of the p-conductivity type, whose surface 5 is provided with a stepped profile. A semiconductor layer 2 consisting of silicon is disposed thereon having a doping of $10^{14}$ at/cm$^3$ and which is of the p-conductivity type. A group of parallel strip-shaped conducting regions 3 is buried therein, whose longitudinal direction is perpendicular to the plane of the drawing and which in this embodiment are of the n-conductivity type and comprise strip-shaped subregions 4, within which doping elements are present, in this embodiment antimony atoms. According to the invention, the strip-shaped conducting regions 3 and the strip-shaped subregions 4 are located with a side facing the substrate in a plane (V1, V2), which is a vicinal plane of a major crystal surface H, in this embodiment the (001) surface, which is perpendicular to the plane of the drawing of the semiconductor body L. The height and the width of the strip-shaped conducting regions 3 are in this embodiment about 15 nm; the width of the strip-shaped subregions is about 1 nm, while the height is about 0.3 nm, which corresponds to about half the lattice constant of silicon. The dimensions of the strip-shaped subregions 4 can be very small according to the invention because the doping elements are selectively incorporated in the proximity of a stage of the stepped profile 5 which has propagated from the substrate surface into the semiconductor layer 2. The small dimensions of the strip-shaped subregions 4 afford a number of advantages according to the invention: in the first place, they substantially do not disturb the movement of the free charge carriers in the strip-shaped conduction regions, as a result of which a high mobility and hence a high conductivity are obtained in these regions. In the second place, they can contain a very high concentration of doping elements, as a result of which the concentration of free charge carriers and hence also the conductivity can be very high in the strip-shaped conducting regions—while nevertheless, due to the small dimensions, only slight mechanical stress is produced in the semiconductor layer 2 and this layer can have favorable crystallographic and electrical properties. In this embodiment, the relative distance of the strip-shaped subregions is about 50 nm. The conducting strip-shaped regions 3 shown here can be used as very small connection conductors in an electronic circuit.

Figure 4:
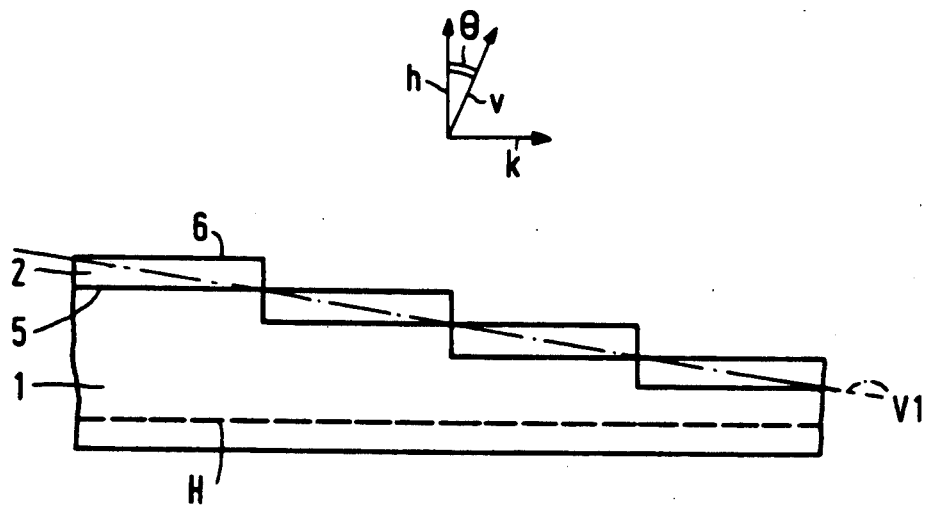
FIGS. 4 to 6 show the semiconductor device of FIG. 1 at successive stages of manufacture.
Figure 5:
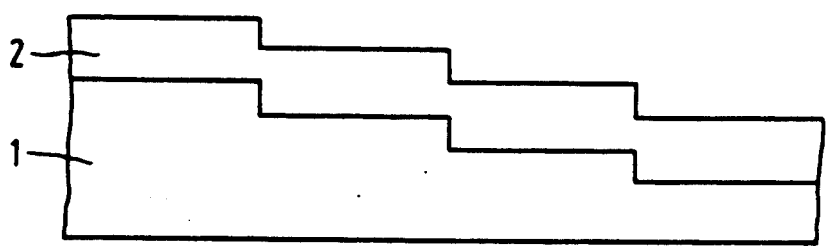
Figure 6:
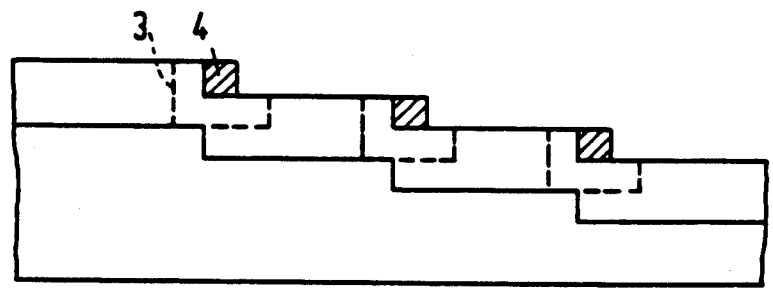

The semiconductor device described can be manufactured as follows (see FIGS. 4 to 6). The starting material is a substrate 1 of monocrystalline p-type silicon having a doping concentration of $10^{14}$ at/cm$^3$ and a thickness of about 500 to 1,000 μm. The substrate 1 is obtained, for example, by sawing out of a semiconductor crystal slices, whose surface V1 with an orientation v has a small misorientation $\theta$ with respect to the major crystal surface H, in this embodiment the (001) surface, with a direction h, in this embodiment the <001> direction. The surface V1 is misorientated in this embodiment with respect to the (001) surface in the <011> direction, designated in FIG. 4 by k. Subsequently, by means of MBE (=Molecular Beam Epitaxy), a monolayer 2 of silicon is grown on the substrate 1 by directing at 700° C. a beam of silicon atoms onto the substrate. The growth of such a monolayer 2 takes place according to the mechanism of the so-called "step flow". Silicon atoms arriving at the surface move to a stage of the stepped profile 5 and are incorporated there, because the energetically most favorable positions are present at the stages. Subsequently (see FIG. 5), the growth of a monolayer is repeated several times, in this case one time, the semiconductor layer 2 then being formed. Then (see FIG. 6) antimony atoms are supplied at the surface at a temperature of 650° C., the surface mobility of these atoms being sufficiently high to reach one stage of the stepped profile propagating in the semiconductor layer 2. As a result, the strip-shaped subregions 4 and a part of the strip-shaped conducting regions 3 around them are obtained, which at this instant are sunken into the semiconductor layer 2. Subsequently, the growth of monolayers is continued by supplying solely silicon atoms, the structure of FIG. 1 then being obtained. The relative distance of the strip-shaped subregions within the group is determined by the misorientation b of the vicinal plane (V1, V2) with the direction v with respect to the major crystal surface H with the direction h. In this embodiment, b is 0.3°, while the height of a strip-shaped subregion is 0.3 nm, as a result of which the relative distance of the strip-shaped subregions w follows from $\tan(\theta)=0.3/w$: w=52 nm.

Figure 2:
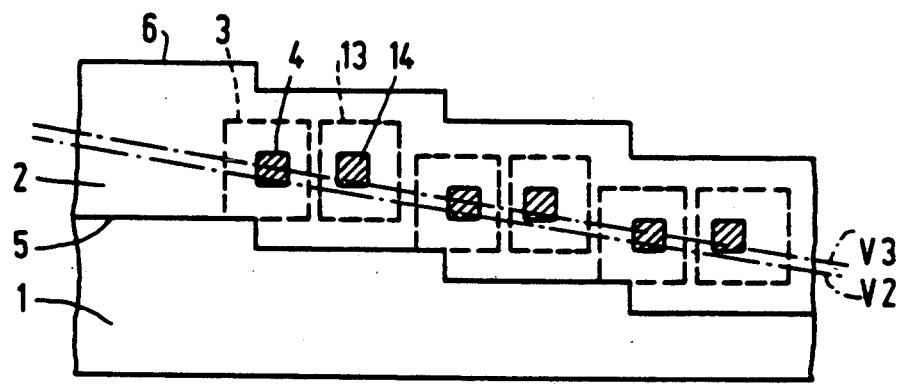
FIG. 2 shows in cross-section a second embodiment of a semiconductor device according to the invention.

FIG. 2 shows in cross-section a second embodiment of a semiconductor device according to the invention. In this embodiment, the semiconductor layer 2 includes two groups of strip-shaped conducting regions (3, 13), which comprise strip-shaped subregions (4, 14), which are located with a side facing the substrate in two parallel planes (V2, V3), which represent the same vicinal plane as in the preceding embodiment. The distance between each strip-shaped conducting region of one group (3) and the closest strip-shaped region of the other group (13) in this embodiment is about 10 nm, which is smaller than the distance between two strip-shaped conducting regions within a group. Therefore, the strip-shaped conducting regions of one group overlap those of the other group, which increases the concentration of the charge carriers. The remaining dimensions, conductivity types and doping concentrations are equal to those of the preceding embodiment. The process of manufacturing is also effected substantially in the same manner as in the preceding embodiment. The only difference resides in the fact that, after the growth of the strip-shaped subregions 4 (see FIG. 6), first a strip-shaped region only comprising silicon is grown within the same monolayer, after which the second group of strip-shaped subregions 14 is grown again in the same monolayer.

Figure 3:
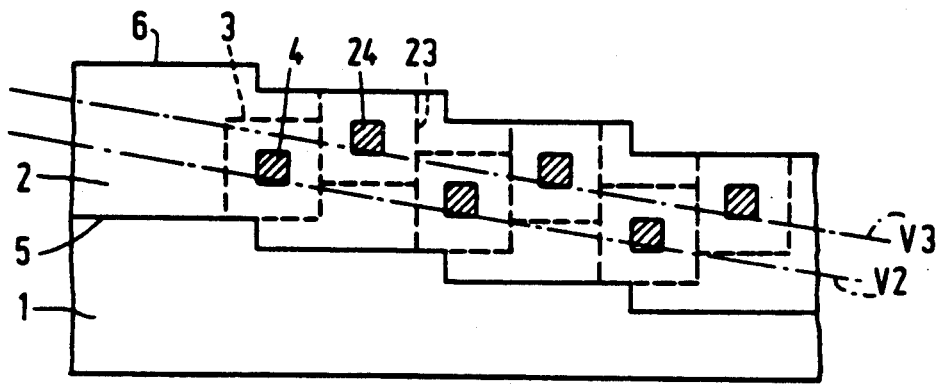
FIG. 3 shows in cross-section a third embodiment of a semiconductor device according to the invention.

FIG. 3 shows in cross-section a third embodiment of a semiconductor device according to the invention. In this embodiment, the semiconductor layer 2 also includes two groups of strip-shaped conducting regions (3, 23), which comprise strip-shaped subregions (4, 24), which are located with a side facing the substrate in two parallel planes (V2, V3), which represent the same vicinal plane as in the preceding embodiment. The distance between each strip-shaped conducting region of one group (3) and the closest strip-shaped region of the other group (23) in this embodiment is about 15 nm, which is smaller than the distance between two strip-shaped conducting regions within a group. The strip-shaped conducting regions of one group just overlap those of the other group, which increases the mobility. The remaining dimensions, conductivity types and doping concentrations are equal to those of the preceding embodiment. The process of manufacturing is also effected in substantially the same manner as in the preceding embodiment. The only difference resides in the fact that, after the growth of the strip-shaped subregions 4 (see FIG. 6), within a monolayer the strip-shaped subregions 24 are grown in a next monolayer in an intermediate position with respect to the first group. In this manner, the densest stacking of strip-shaped conducting regions is obtained, which form part of two groups, just overlap each other and give rise to a high density of charge carriers and hence to a high conductivity.

Figure 7:
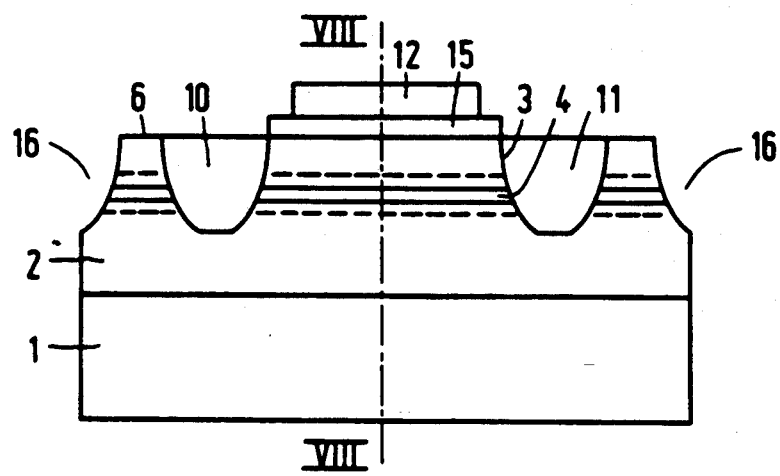
FIG. 7 shows in cross-section a MOS field effect transistor according to the invention.
Figure 8:
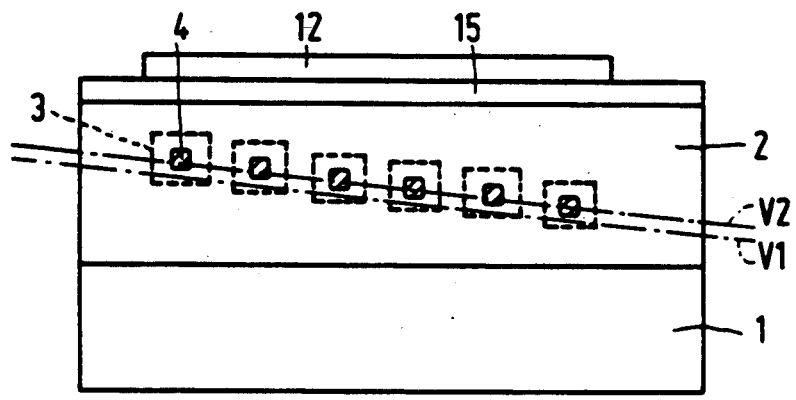
FIG. 8 shows the MOS field effect transistor of FIG. 7 in a cross-section taken on the line VIII—VIII.
Figure 9:
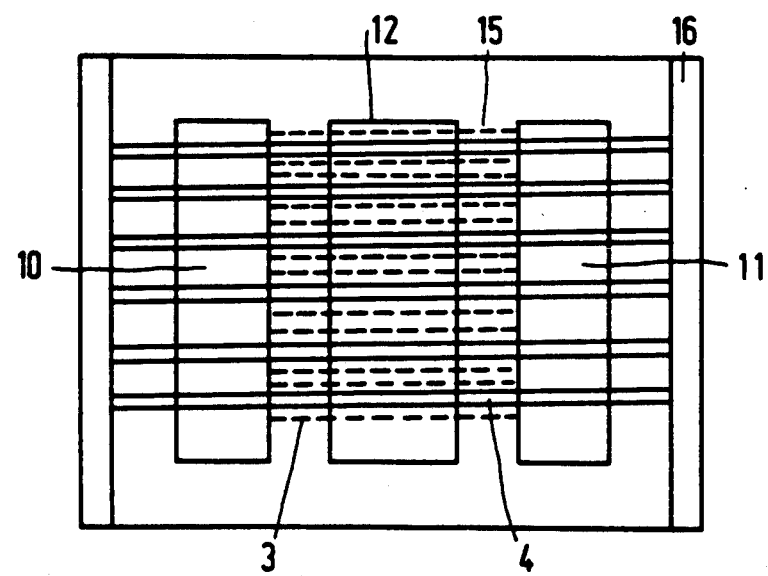
FIG. 9 shows the MOS field effect transistor of FIG. 7 in a plan view.

FIG. 7 shows in cross-section a further embodiment of a semiconductor device according to the invention. This embodiment is a field effect transistor comprising a semiconductor body which includes a substrate 1, which in this embodiment consists of silicon having a doping of $10^{14}$ at/cm$^3$ and of the p-conductivity type, whose surface is provided with a stepped profile. On this profile is disposed a semiconductor layer 2 consisting of silicon having a doping of $10^{14}$ at/cm$^3$ and of the p-conductivity type. In this layer is buried a group of parallel strip-shaped conducting regions 3, whose longitudinal direction is parallel to the plane of the drawing, which are in this embodiment of the n-conductivity type and which comprise strip-shaped subregions 4, within which doping elements are present, in this embodiment consisting of phosphorus atoms. A cross-section of the field effect transistor of FIG. 7 and taken on the line VIII—VIII is shown in FIG. 8 and a plan view is shown in FIG. 9. According to the invention, the strip-shaped conducting regions 3 and the strip-shaped subregions 4 are located with a side facing the substrate in a plane (V1, V2) representing a vicinal plane of a major crystal surface H, in this embodiment the (001) surface perpendicular to the plane of the drawing of the semiconductor body. The height and the width of the strip-shaped conducting regions 3 are in this embodiment about 15 nm; the width of the strip-shaped subregions is about 1 nm, while the height is about 0.3 nm, which corresponds to half the lattice constant of silicon. The dimensions of the strip-shaped subregions 4 can be very small according to the invention because the doping elements are selectively incorporated in the proximity of a stage of the stepped profile, which has propagated from the substrate surface into the semiconductor layer 2. The small dimensions of the strip-shaped subregions 3 according to the invention afford a number of advantages: in the first place, they now substantially do not disturb the movement of the free charge carriers in the strip-shaped conducting regions, as a result of which a high mobility and hence a high conductivity are obtained in these regions. An additional advantage is that they comprise a very high concentration of doping elements—as a result of which the concentration of free charge carriers and hence also the conductivity can be very high in the strip-shaped conducting regions 3—, while nevertheless, due to the small dimensions, only slight mechanical stress is produced in the semiconductor layer 2 and this layer can have favorable crystallographic and electrical properties. In this embodiment, the relative distance of the strip-shaped subregions is about 20 nm. Thus far, the semiconductor does not differ, apart from the relative distance of the strip-shaped subregions 4, from the embodiment shown with reference to FIG. 1. For simplification, the stepped profile in the surface of the substrate 1 and in the surface of the semiconductor layer 2 is omitted. The semiconductor device further comprises two strip-shaped regions 10, 11, which are sunken into the semiconductor layer 2, are of the n-conductivity type, have a doping concentration of about $10^{19}$ at/cm$^3$ and are connected to the strip-shaped conducting regions 4, 14. On the surface of the semiconductor body 6 is provided, between the aforementioned sunken regions 10, 11 constituting the source and the drain of the field effect transistor, a strip-shaped region 15 containing SiO$_2$, on which a strip-shaped conducting region 12 is disposed, which contains tungsten and constitutes the gate electrode of the field effect transistor. The dimensions of the source 10 and the drain 11 are $1 \times 3$ $\mu$m$^2$; those of the gate electrode 12 are $0.5 \times 3$ $\mu$m$^2$ and those of the strip-shaped region are $1.0 \times 3$ $\mu$m$^2$. The individual transistors are mutually separated by separation grooves 16, which are provided in the surface of the semiconductor body. The depth of the source 10 and the drain 11 is about 0.1 $\mu$m; the thickness of the gate electrode is 0.1 $\mu$m and the strip-shaped conducting regions 4, 14 lie at a depth of about 20 nm. Due to the fact that, as already explained above, these regions have a very high conductivity, the MOS field effect transistor of this embodiment has a higher transconductance than comparable MOS field effect transistors having these dimensions.

The field effect transistor of this embodiment can be manufactured as follows. First the semiconductor body L is formed in the manner already described for the semiconductor device shown in FIGS. 1 to 3. An about 10 to 20 nm thick oxide layer 15 containing thermal oxide is provided thereon. Subsequently, a masking layer consisting, for example, of photolacquer is provided on the semiconductor body and in this masking layer windows are opened by means of photolithography and etching at the area of the source 10 and the drain 11. For example by means of ion implantation of phosphorus ions, the source 10 and the drain 11 are then formed. After the photolacquer has been removed and the structure has been cleaned, a tungsten-containing layer 12 is provided on the semiconductor surface, for example by means of sputtering. Subsequently, a part of this layer is removed by means of photolithography and etching with a conventional etchant, as a result of which the gate electrode 12 is obtained. By means of photolithography and etching, the separation grooves 16 are then provided. The source and the drain are finally provided with connection conductors in a conventional manner.

It should be noted here that the semiconductor layers may also have conductivity types or doping concentrations other than those mentioned here. Other doping elements may also be used.

The invention is not limited to the embodiments described because many modifications and variations are possible for those skilled in the art without departing from the scope of the invention. For example, semiconductor materials compositions of the semiconductor materials chosen other than those mentioned in the embodiments may be used. Inter alia instead of or besides binary materials also ternary or quaternary III-V semiconductor materials may be used. In this manner, for example semiconductor devices may be obtained in which a strip-shaped subregion containing doping elements (for example silicon atoms) is included in a quasi unidimensional heterostructure, for example in the material system gallium arsenide-gallium aluminum arsenide in the region comprising the material with the highest band edge (gallium aluminum arsenide) and in the proximity of the hetero-junction. Besides in MOS field effect transistors, the invention may also be used in MES-field effect transistors as well as in bipolar transistors, in which a very thin and highly conducting base can be formed by the use of strip-shaped conducting regions according to the invention. As a result, bipolar transistors having excellent properties are obtained. Further, it should be noted that, when the strip-shaped conducting regions do not overlap each other, a particular advantage is obtained: in this case, the conductivity perpendicular to the strip-shaped conducting regions will be very low, which fact may be utilized advantageously in numerous applications. For example, when a number of strip-shaped conducting regions form part of a transistor, a smaller fan-out of the current from source to drain will occur outside the region covered with the gate electrode due to the limited conductivity perpendicular to the strip-shaped conducting regions. As a result, it becomes possible, for example, to arrange these devices more closely to each other and better characteristics become possible.

The conductivity types may also be replaced (simultaneously) by the opposite conductivity types. Further, in general, the semiconductor layers and the conducting layers may also be provided by means of techniques other than those mentioned herein: for example, instead of MOCVD, VPE or MBE may also be used, while instead of sputtering, for example, vapor deposition may also be used.

What is claimed is:

1. A semiconductor device comprising a semiconductor body having a semiconductor substrate and a semiconductor layer disposed thereon, said semiconductor layer comprising at least one group of parallel strip-shaped conducting regions having a higher conductivity than that of the semiconductor layer in which the conducting regions are located, said conducting regions comprising strip-shaped subregions completely enclosed within said conducting regions, and doping elements provided within said strip-shaped subregions, the strip-shaped conducting regions and the enclosed strip-shaped subregions being located with a side facing the substrate substantially in a selected plane, which is a vicinal plane of a major crystal surface of the semiconductor body.

2. A semiconductor device as claimed in claim 1, characterized in that the conducting strip-shaped regions have, in a direction perpendicular to a longitudinal direction, dimensions which are substantially equal to a wavelength of free charge carriers present in these regions.

3. A semiconductor device as claimed in claim 1 or 2, characterized in that dimensions of the strip-shaped subregions in a direction perpendicular to a longitudinal direction are smaller than corresponding dimensions of the conducting strip-shaped regions.

4. A semiconductor device as claimed in claim 1 or 2, characterized in that the strip-shaped subregions have, in a direction perpendicular to a longitudinal direction, dimensions which are from about a quarter to about one lattice constant of the semiconductor material of the semiconductor layer.

5. A semiconductor device as claimed in claim 1 or 2, characterized in that the volume concentration of the doping elements within the strip-shaped subregions is higher than the maximum volume concentration in bulk semiconductor material comprising the semiconductor layer.

6. A semiconductor device as claimed in claim 1 or 2, characterized in that the major crystal surface is the (001) surface and the vicinal plane is parallel to the surface of the semiconductor body and has a misorientation with respect to the major crystal surface in the (011) or the (0$\underline{1}$1) direction of at most a few degrees.

7. A semiconductor device as claimed in claim 1 or 2, characterized in that the semiconductor layer comprises at least two groups of parallel strip-shaped conducting regions, which are arranged above each other and are orientated with respect to each other in such a manner that a strip-shaped region of one group is located, viewed in projection, between two strip-shaped regions of an adjacent group.

8. A semiconductor device as claimed in claim 1 or 2, characterized in that the conducting strip-shaped regions are of the n-conductivity type.

9. A semiconductor device as claimed in claim 8, characterized in that the semiconductor layer comprises a III-V semiconductor material.

10. A semiconductor device as claimed in claim 9, characterized in that the conducting strip-shaped regions have a width lying between about 40 and 200 nm and the strip-shaped subregions have a width lying between about 2 and 20 nm.

11. A semiconductor device as claimed in claim 1 or 2, characterized in that the semiconductor layer comprises silicon.

12. A semiconductor device as claimed in claim 11, characterized in that the conducting strip-shaped regions have a width of about 10 to 100 nm and in that the strip-shaped subregions have a width lying between about 2 and 20 nm.

13. A semiconductor device as claimed in claim 1 or 2, in that the strip-shaped conducting regions are used as connection conductors in an electronic circuit.

14. A semiconductor device as claimed in claim 9, characterized in that the semiconductor body comprises a semiconductor layer structure comprising successively in a cross-section at least the semiconductor substrate having a comparatively low doping concentration, a semiconductor layer having a comparatively low doping concentration, in which the group of conducting strip-shaped regions having a comparatively high concentration of free charge carriers is buried, two strip-shaped semiconductor regions sunken from the surface into the semiconductor layer and having a comparatively high doping concentration, whose longitudinal direction is substantially perpendicular to a longitudinal axis of the group of conducting strip-shaped regions and which are connected to the strip-shaped regions, and an isolating layer, which is arranged between the sunken strip-shaped semiconductor regions on the surface and on which a conducting layer is disposed.

15. A semiconductor device as claimed in claim 1 or 2, further comprising means for providing a current in a longitudinal direction through the strip-shaped conducting regions.

16. A semiconductor device as claimed in claim 1 or 2, characterized in that the semiconductor substrate is provided with a stepped profile which continues into the semiconductor layer disposed thereon, and that the doping elements provided within said strip-shaped subregions are positioned at a stage of the stepped profile.

* * * * *